(12) United States Patent
Crowley

(10) Patent No.: US 7,750,631 B2
(45) Date of Patent: Jul. 6, 2010

(54) PASSENGER INSPECTION SYSTEM AND METHODS FOR USING THE SAME

(75) Inventor: Christopher W. Crowley, San Diego, CA (US)

(73) Assignee: Morpho Detection, Inc., Newark, CA (US)

( * ) Notice: Subject to any disclaimer, the term of this patent is extended or adjusted under 35 U.S.C. 154(b) by 86 days.

(21) Appl. No.: 11/767,101

(22) Filed: Jun. 22, 2007

(65) Prior Publication Data

US 2008/0315874 A1    Dec. 25, 2008

(51) Int. Cl.
*G01V 3/00* (2006.01)
(52) U.S. Cl. ...................... 324/307; 324/309
(58) Field of Classification Search .......... 324/300–322
See application file for complete search history.

(56) References Cited

U.S. PATENT DOCUMENTS

| | | | |
|---|---|---|---|
| 5,039,981 | A | 8/1991 | Rodriguez |
| 5,467,017 | A | 11/1995 | Duerr et al. |
| 5,585,575 | A | 12/1996 | Corrigan et al. |
| 5,592,083 | A | 1/1997 | Magnuson et al. |
| 5,594,338 | A | 1/1997 | Magnuson |
| 5,600,303 | A | 2/1997 | Husseiny et al. |
| 5,841,346 | A | 11/1998 | Park |
| 5,956,122 | A | 9/1999 | Doster |
| 5,986,455 | A | 11/1999 | Magnuson |
| 5,992,094 | A | 11/1999 | Diaz |
| 6,073,499 | A | 6/2000 | Settles |
| 6,119,096 | A | 9/2000 | Mann et al. |
| 6,194,898 | B1 | 2/2001 | Magnuson et al. |
| 6,268,724 | B1 | 7/2001 | Crowley |
| 6,291,994 | B1 | 9/2001 | Kim et al. |
| 6,375,697 | B2 | 4/2002 | Davies |
| 6,392,408 | B1 | 5/2002 | Barrall et al. |
| 6,771,064 | B2 | 8/2004 | Leibowitz et al. |
| 6,952,163 | B2 | 10/2005 | Huey et al. |

(Continued)

FOREIGN PATENT DOCUMENTS

EP    1526386 A1    4/2005

(Continued)

OTHER PUBLICATIONS

Crowley C. et al: "A Novel Shoe Scanner Using an Open-Access Quadrapole Resonance and Metal Sensor" Proceedings of SPIE, vol. 6538, May 4, 2007, pp. 6538OJ-1-6538OJ-5, XP002496925.

(Continued)

*Primary Examiner*—Brij B Shrivastav
*Assistant Examiner*—Dixomara Vargas
(74) *Attorney, Agent, or Firm*—Armstrong Teasdale LLP

(57) ABSTRACT

A passenger inspection system includes a metal detection sensor integrated with a quadrupole resonance sensor and configured to detect weapons and/or explosives that may be present proximate the feet and/or lower legs of a person. Additionally, a weapons detection sensor may include one or more pairs of transmit coils and receive coils that are vertically mounted to the interior sidewalls of the passenger inspection system and configured to detect symmetrical and nonsymmetrical threats present on a portion of a person's legs. Methods for operating embodiments of the passenger inspection system are also disclosed.

12 Claims, 11 Drawing Sheets

U.S. PATENT DOCUMENTS

| | | | |
|---|---|---|---|
| 6,970,088 B2 | 11/2005 | Kovach | |
| 7,047,829 B2 | 5/2006 | Napoli | |
| 7,049,814 B2 | 5/2006 | Mann | |
| 7,106,058 B2 * | 9/2006 | Wilker et al. | 324/300 |
| 7,154,266 B2 | 12/2006 | Czipott et al. | |
| 7,327,137 B1 * | 2/2008 | Crowley et al. | 324/300 |
| 7,352,180 B2 * | 4/2008 | Manneschi | 324/307 |
| 7,365,536 B2 * | 4/2008 | Crowley et al. | 324/300 |
| 7,397,239 B2 * | 7/2008 | Crowley et al. | 324/300 |
| 2004/0113781 A1 | 6/2004 | Stis | |
| 2004/0222790 A1 | 11/2004 | Karmi et al. | |
| 2005/0024199 A1 | 2/2005 | Huey et al. | |
| 2005/0073307 A1 | 4/2005 | Manneschi | |
| 2005/0109843 A1 | 5/2005 | Dove et al. | |
| 2006/0012366 A1 | 1/2006 | Feldman et al. | |

FOREIGN PATENT DOCUMENTS

| | | |
|---|---|---|
| EP | 1923724 A | 5/2008 |
| WO | WO 99/21148 | 4/1999 |

OTHER PUBLICATIONS

Schneiderbauer, K., Written Opinion of the International Authority for International Searching Authority for application No. PCT/US2008/062630. Nov. 28, 2008.

Geronimo E. Poletto, Tristan M. Osan & Daniel J. Pusiol, Pulsed 14N NQR Device Designed to Detect Substances in the Presence of Environmental Noise; Hyperfine Interactions Kluwer Academic Publishers Netherlands; presented at the XVII International Symposium on Nuclear Quadrupole Interactions, held in Bonn Germany 2004; vol. 159, No. 1-4, 2004, pp. 127-130.

James Gilden, "Race is On for Security Gear", Business Itinerary, Special to the LA Times, Sep. 23, 2006; http://www.latimes.com/business/la-fi-biztravel23sep23,1,2032881.story?ctrack=1&cset=true.

Joel B. Miller & Geoffrey A. Barrall "Explosives Detection with Nuclear Quadrupole Resonance", American Scientist, Jan.-Feb. 2005, vol. 93, No. 1, p. 50, http:/www.americanscientist.org/template/AssetDetail/assetid/39131.

* cited by examiner

PASSENGER INSPECTION SYSTEM AND METHODS FOR USING THE SAME

BACKGROUND OF THE INVENTION

1. Field of the Invention

The field of the invention relates to security inspection systems generally, and more particularly, to a passenger inspection system that can detect weapons proximate a passenger's feet and/or leg(s).

2. Discussion of Related Art

Extant security inspection systems use known technologies such as nuclear magnetic resonance (NMR), nuclear quadrupolar resonance (NQR), metal detection, and x-rays, among others, to detect weapons, explosives, illegal drugs, and other kinds of substances of interest in and/or on an item, such as shoes, luggage, clothing, and the like.

When security is heightened, persons to be scanned are often required to remove their shoes. The shoes are then typically placed in plastic tubs that move, via a conveyor belt, into an x-ray scanner. Additionally, or alternatively, security personnel may visually inspect the shoes, swab the interior and/or exterior of the shoes for trace detection purposes, and/or pass a hand-held metal detector over the shoes. Such methods consume time, inconvenience passengers, and slow the rate of a security checkpoint's throughput. A need therefore exists for a solution that enables simple and accurate detection of weapons, explosives, drugs, and/or other substances of interest that may be hidden in a person's shoes while the shoes are being worn. Another need exists for a solution that provides simple and accurate detection of weapons, explosives, illegal drugs, and/or other substances of interest that may be hidden, alternatively or additionally, in the person's socks and/or clothing present on the person's leg(s) while such socks and/or clothing are being worn.

Various devices have been developed in attempts to provide solutions to one or more of these needs. One example of such a device is a walkthrough quadrupole resonance ("QR") shoe scanner that positions a QR sensor in the floor of the shoe scanner and flanks the QR sensor with two opposing vertical side walls that are electrically connected to the floor of the shoe scanner. A channel formed by the space between the opposing vertical side walls extends the length of the shoe scanner so that a person can enter one (open) end of the shoe scanner and exit the opposite (open) end. As the person stands in the central portion of the QR shoe scanner, the QR sensor operates to detect alarm objects (e.g., weapons, explosives, illegal drugs, etc.) in or on the person's shoes, socks, or articles of clothing.

Another example is a passenger screening system that positions a QR sensor in a floor of the passenger screening system and flanks the QR sensor with three vertical, electrically conductive walls that are joined together and attached to the floor of the passenger screening system. The three vertical, electrically conductive walls include two electrically conductive and opposing side walls and one electrically conductive end wall. A channel formed by the space between the opposing side walls extends from an open end of the passenger screening system to the end wall that forms the opposite end of the passenger screening system so that a person can enter and exit the passenger screening system only from the open end of the channel. The passenger screening system also includes a metal detection sensor having two metal detector conductive traces—a first metal detector conductive trace positioned on one of the opposing side walls; and a second metal detector conductive trace positioned on the other of the opposing side walls.

The metal detector conductive traces are configured to generate a uniform magnetic field when no metallic object or substance is present within the scanning area. Any metallic object or substance that is later positioned within the scanning area will disturb the otherwise balanced magnetic field generated by the metal detection conductive traces. This disturbance creates an electrical and/or magnetic imbalance between the metal detector conductive traces, which causes the passenger screening system to receive a signal indicating that a metallic object has been detected within the scanning area.

It would further be advantageous to provide an improved metal detector apparatus and method configured to detect weapons concealed proximate a person's shoes, and/or configured to detect weapons proximate the person's leg(s).

BRIEF DESCRIPTION OF THE INVENTION

The technology disclosed herein overcomes the disadvantages associated with the related art and meets the needs discussed above by providing an inspection system that, among other advantages and technical effects provides embodiments of a system and methods for detecting one or more weapons that are proximate a person's shoes and/or lower legs.

For example, previously developed types of metal detection sensors needed to be shielded from a QR sensor to operate. The inventor discovered however, that a QR sensor, a metal detection sensor, and a weapons detection sensor, can be positioned within a common space and that at least the metal detection sensor can share one or more components of the QR sensor. This discovery permits a single inspection system to identify target substances as explosives or contraband and to detect whether one or more weapons are present proximate a person's feet and/or lower legs.

It was also discovered that longitudinal and transverse RF magnetic fields can be used to detect weapons of different types and/or symmetries, and that such magnetic fields can be produced using specially-configured, corresponding pairs of transmit coils and receive coils that are vertically mounted on opposing sidewalls of the inspection system.

Technical effects of an embodiment of the invention may include one or more of the following: identifying a known explosive, determining that a weapon has been detected, determining that no weapon has been detected, signaling an "all clear," and/or activating an alarm.

BRIEF DESCRIPTION OF THE DRAWINGS

The above and other aspects of various embodiments of the claimed invention will become more apparent when the following detailed description is considered together with the accompanying drawings in which:

DETAILED DESCRIPTION OF THE INVENTION

Reference is made herein to the accompanying drawings briefly described above, which show by way of illustration various embodiments of the claimed invention. Persons of ordinary skill in the above-referenced technological field will recognize that other embodiments may be utilized, and that structural, electrical, and procedural changes may be made without departing from the scope of the claimed invention. As used herein, the singular (illustratively, "a shoe") includes the plural (illustratively, "one or more shoes"), and the plural includes the singular. As used herein, the term "shoe" comprises any type of natural or man-made article that can be worn on a human foot and/or a portion of a human leg. As used herein, the term "kiosk" comprises an area or structure, open on one or more sides, that is configured for one or more special uses that are described herein. Non-limiting examples of such special uses include identity card identification and/or biometric identification of a registered traveler, trace detection analysis of particles and/or substances derived from a person, detection of weapons proximate the person's shoe(s), detection of weapons proximate one or both of the person's lower legs, and the like. As used herein, the term "proximate" broadly encompasses an object (concealed or not) that is adjacent, in, and/or on another object. Unless otherwise indicated, the terms "passenger" and "person" are used interchangeably herein.

Embodiments of the passenger inspection system and methods described herein may also be implemented at seaports, sports stadiums, racetracks, public buildings, public transportation facilities, prisons, hospitals, power plants, court houses, office buildings, hotels, and casinos, among others. As a matter of convenience, some embodiments of the invention may be described in the context of a walk-up identification kiosk implemented as part of an improved aviation security system.

Figure 1:
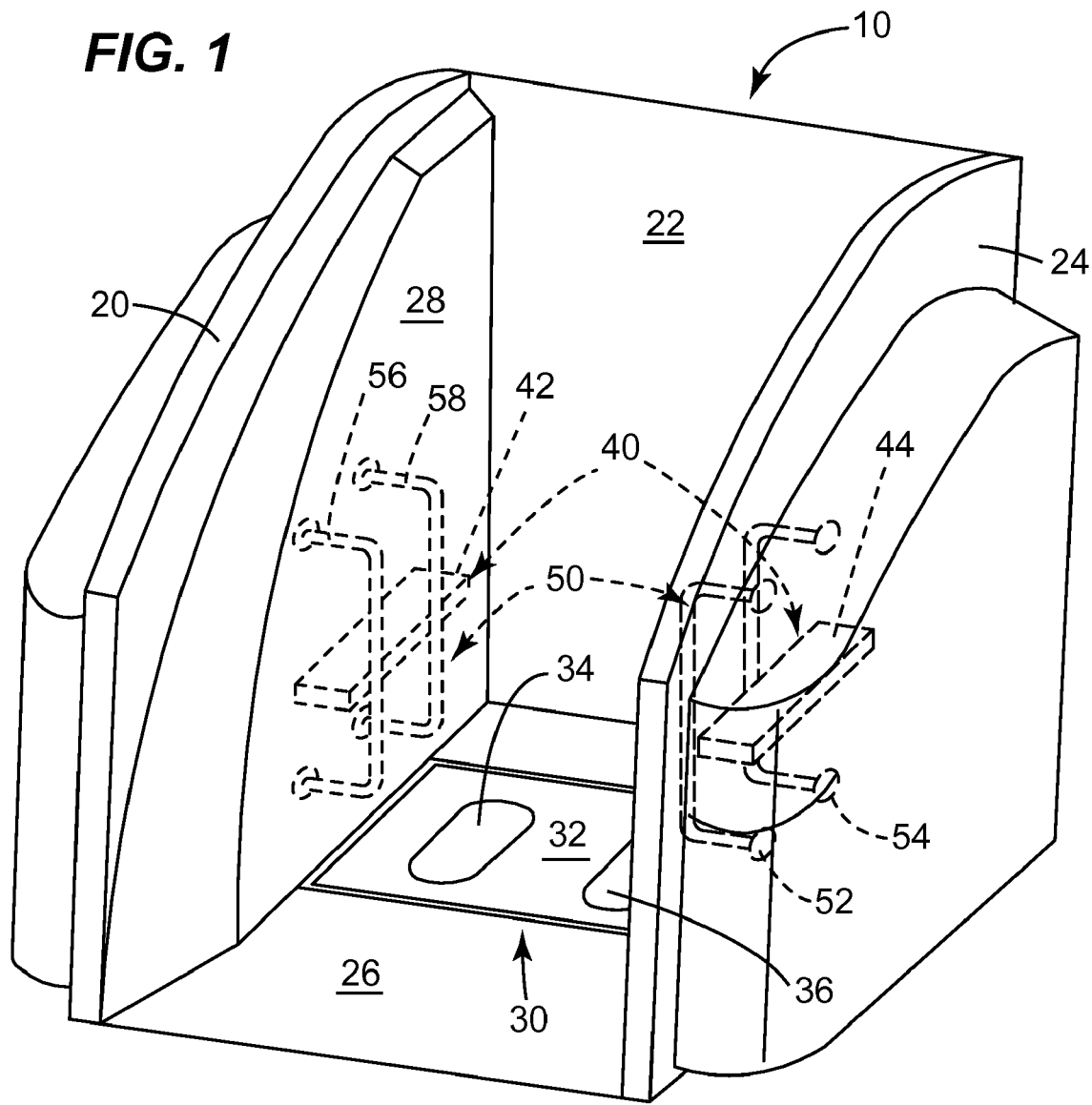
FIG. 1 is a front perspective view of an embodiment of a passenger inspection system.
Figure 2:
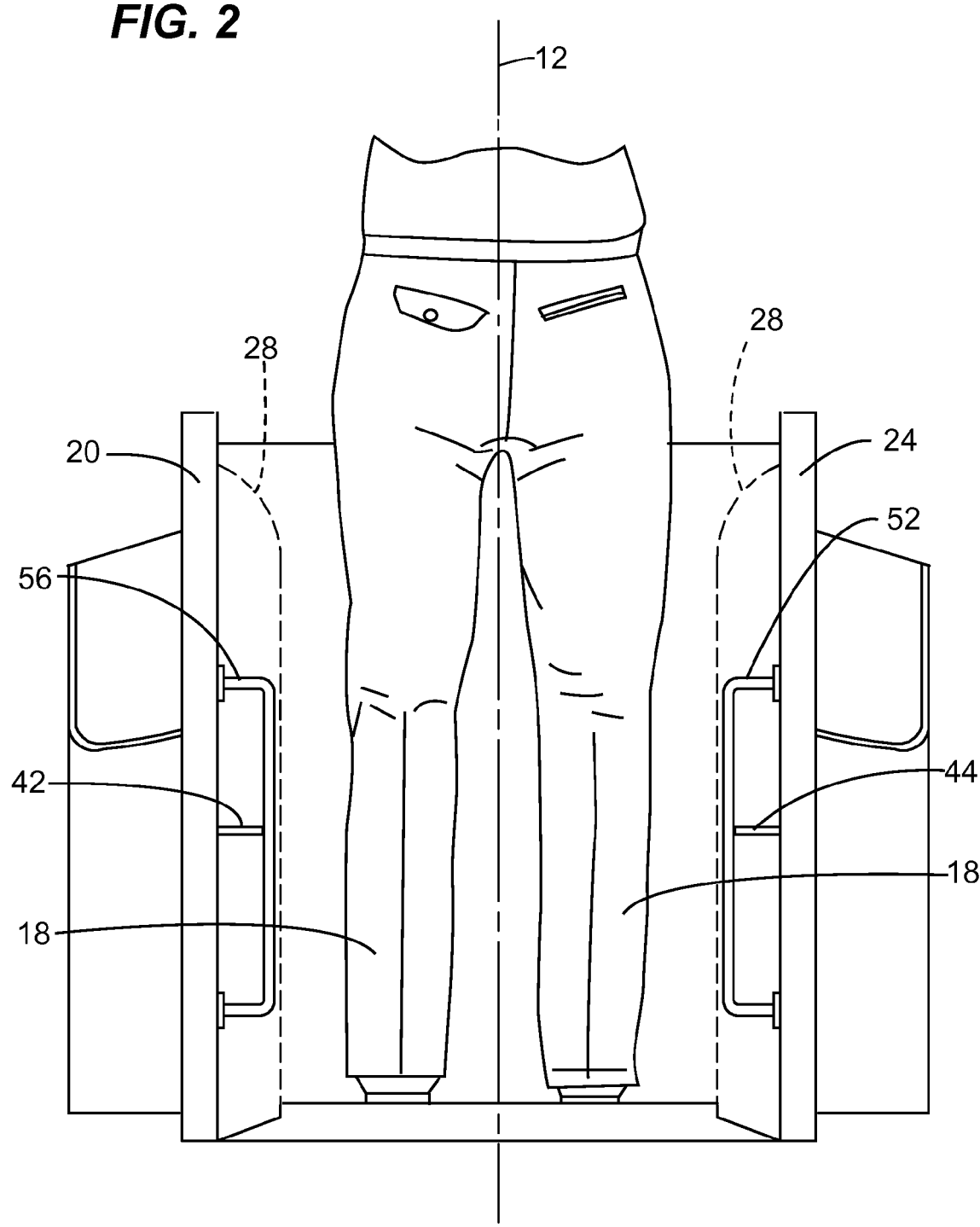
FIG. 2 is an end view of the embodiment of the passenger inspection system shown in FIG. 1.
Figure 3:
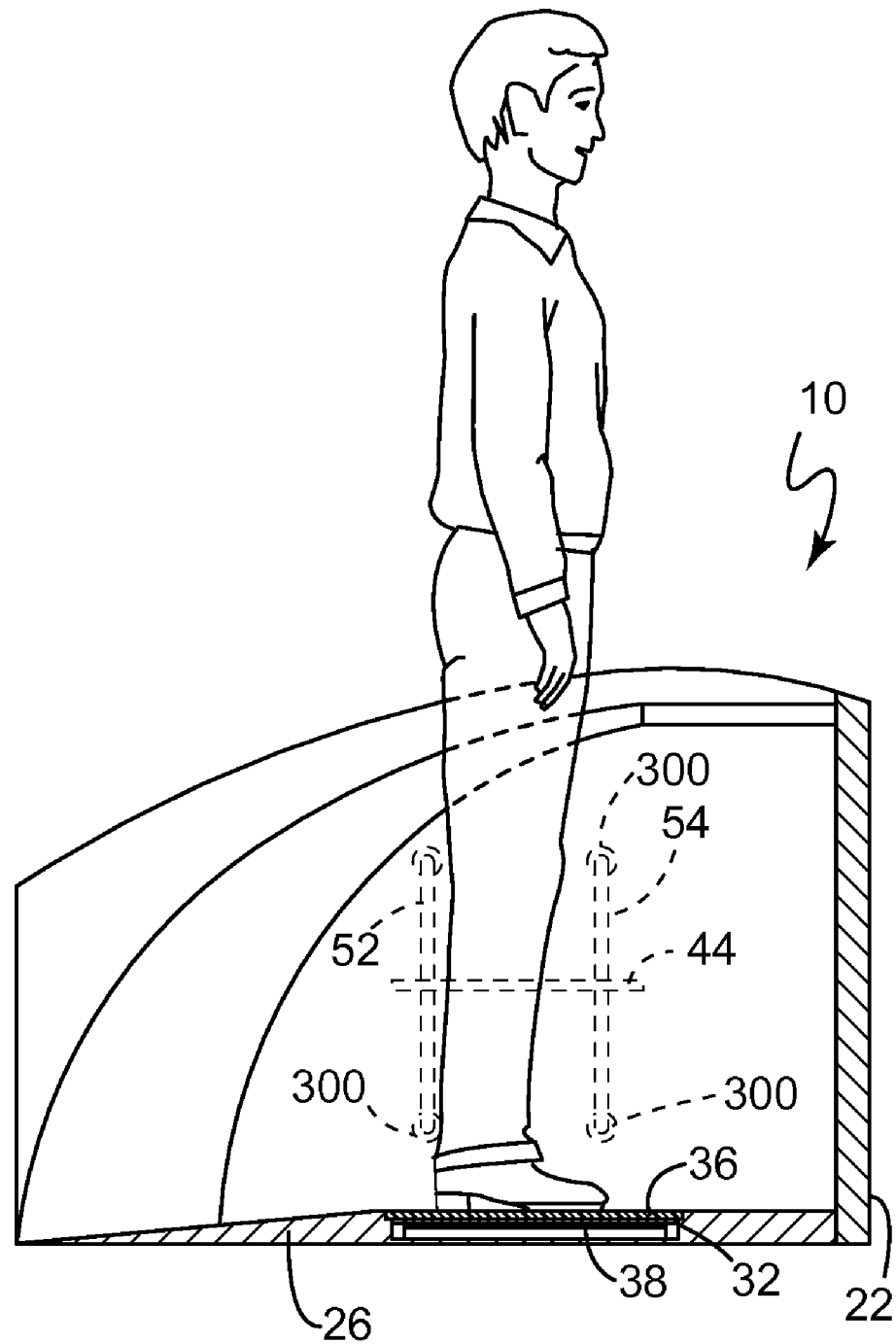
FIG. 3 is a right side view of the embodiment of the passenger inspection system shown in FIG. 1 illustrating a first, second, and third detection zones.
Figure 4:
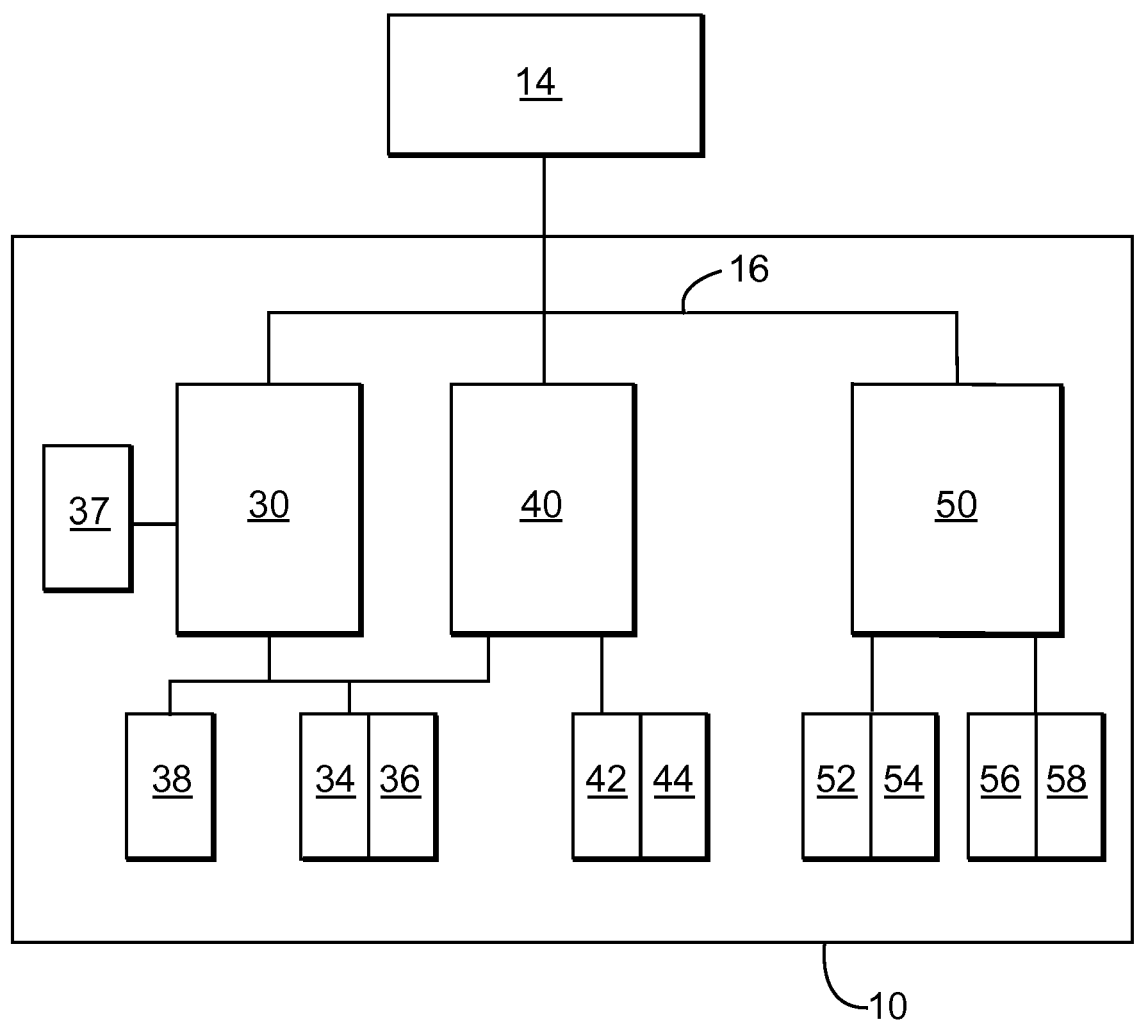
FIG. 4 is a schematic illustrating an embodiment of an apparatus configured for detecting one or more weapons concealed proximate a shoe and/or lower leg of an inspected person.

FIG. 1 is a front perspective view of an exemplary passenger inspection system 10. FIG. 2 is an end view of the exemplary passenger inspection system 10 shown in FIG. 1. FIG. 3 is a side view of the exemplary passenger inspection system 10 shown in FIG. 1. FIG. 4 is a schematic illustration of an embodiment of the passenger inspection system 10 shown in FIG. 1.

Referring jointly to FIGS. 1, 2, 3, and 4, an embodiment of the passenger inspection system 10 includes several sensors 30, 40, and 50, which may be used individually and/or in combination with each other to detect weapons that are proximate a person's shoes and/or lower legs.

The first sensor 30 is referred to as either an inductive sensor or as a quadrupole resonance ("QR") sensor, and includes a printed circuit board 32, electrically conductive traces 34 and 36, a QR transmit coil 37, and an inductive coil 38. The electrically conductive traces 34 and 34 may be mounted on the printed circuit board 32 in mirror symmetry about the medial axis 12. The QR transmit coil 37 and the QR inductive coil 38 may each be positioned a predetermined distance below the electrically conductive traces 34,36. The QR transmit coil 37 may be coupled with a radio frequency source (60 in FIG. 5). The QR inductive coil 38 may be coupled with an amplifier (not shown), which may be coupled with a computer 14 configured to process and analyze signals outputted by the amplifier to identify an explosive or other type of contraband. The QR inductive coil 38 may be configured and positioned to inductively couple with either or both of the electrically conductive traces 34,36.

The second sensor 40 is referred to as a metal detection sensor, and includes planar electrically conductive traces 42 and 44 that are each mounted substantially horizontally to interior surfaces of opposing sidewalls 20,24, respectively, of the passenger inspection system 10. Each of the electrically conductive traces 42,44 is mounted a predetermined distance above the floor 26 of the passenger inspection system 10. As further explained below, the second sensor 40 may also be configured to generate either a QR resonance current in the QR transmit coil 37.

The third sensor 50 is referred to as a weapons detection sensor, and includes one or more spaced-apart transmit coils 52,54 mounted substantially vertically on the interior surface of the same sidewall 24. The transmit coils 52 and 54, which may pass through or proximate the electrically conductive trace 44, are electrically insulated from the electrically conductive trace 44. The third sensor 50 further includes one or more spaced-apart receive coils 56,58 mounted substantially vertically on the interior surface of the same (opposite) sidewall 20. The receive coils 56 and 58, which may pass through or proximate the electrically conductive trace 42, are electrically insulated from the electrically conductive trace 42. Panels 28 may be used to cover the sensors 30,50 from view. One panel 28 may couple with the sidewall 20, the rear wall 22, and/or the floor 26. Another panel 28 may couple with the sidewall 24, the rear wall 22, and/or the floor 26.

Each of the sensors 30, 40, and 50 may be configured to detect a different category of alarm object. For example, the QR sensor 30 may be configured to identify one or more target substances positioned proximate one or more shoes worn by a person as explosives, narcotics, or other type of contraband. The target substances identified by the QR sensor 30 may contact or be concealed within one or both shoes.

The metal detection sensor 40 may also be configured to detect one or more weapons that are symmetric or anti-symmetric about a medial plane that separates an inspected person's foot from the other. A weapon detected on only one side of the medial plane is said to be asymmetric. Weapons detected on both sides of the medial plane are said to be symmetric.

The weapons detection sensor 50 may be configured to detect objects, such as weapons, that are positioned proximate either or both the person's lower legs from about the ankles upwards. The objects detected by the weapons detection sensor 50 may be concealed in clothing/footwear that covers all or a portion of the person's lower legs.

Referring to FIG. 2, a person is illustratively shown standing in the passenger inspection system 10, with one foot above the electrically conductive trace 34, and with the other foot above the electrically conductive trace 36. The person's lower legs 18, from about the ankles upwards, may be positioned between the electrically conductive trace 44 and transmit coils 52,54 (see FIG. 1) on one side, and the electrically conductive trace 42 and receive coils 56,58 on the other side.

Additionally, the passenger inspection system 10 may be used in combination with a conventional walkthrough metal detector to improve passenger throughput and/or to reduce false alarms. With the passenger inspection system 10 configured to scan from above about knee level downwards, the conventional walkthrough metal detector may be configured to scan from about knee level upwards, which speeds scan times and improves accuracy of detection versus a conventional metal detector configured to scan from about floor level upwards to about head level.

It will be appreciated that ankle level, knee level, and waist level will vary from person to person. Accordingly, each of these terms encompasses a range of heights as measured upwards from a floor of the passenger inspection system 10. In an embodiment, a predetermined average height for ankle level, an average height for knee level, and an average height for waist level may be utilized. By way of illustration and not limitation, this predetermined average height may be determined by measuring the actual ankle, knee, and waist heights of a predetermined number of people and then mathematically calculating an average ankle height, an average knee height, and an average waist height.

Figure 5:
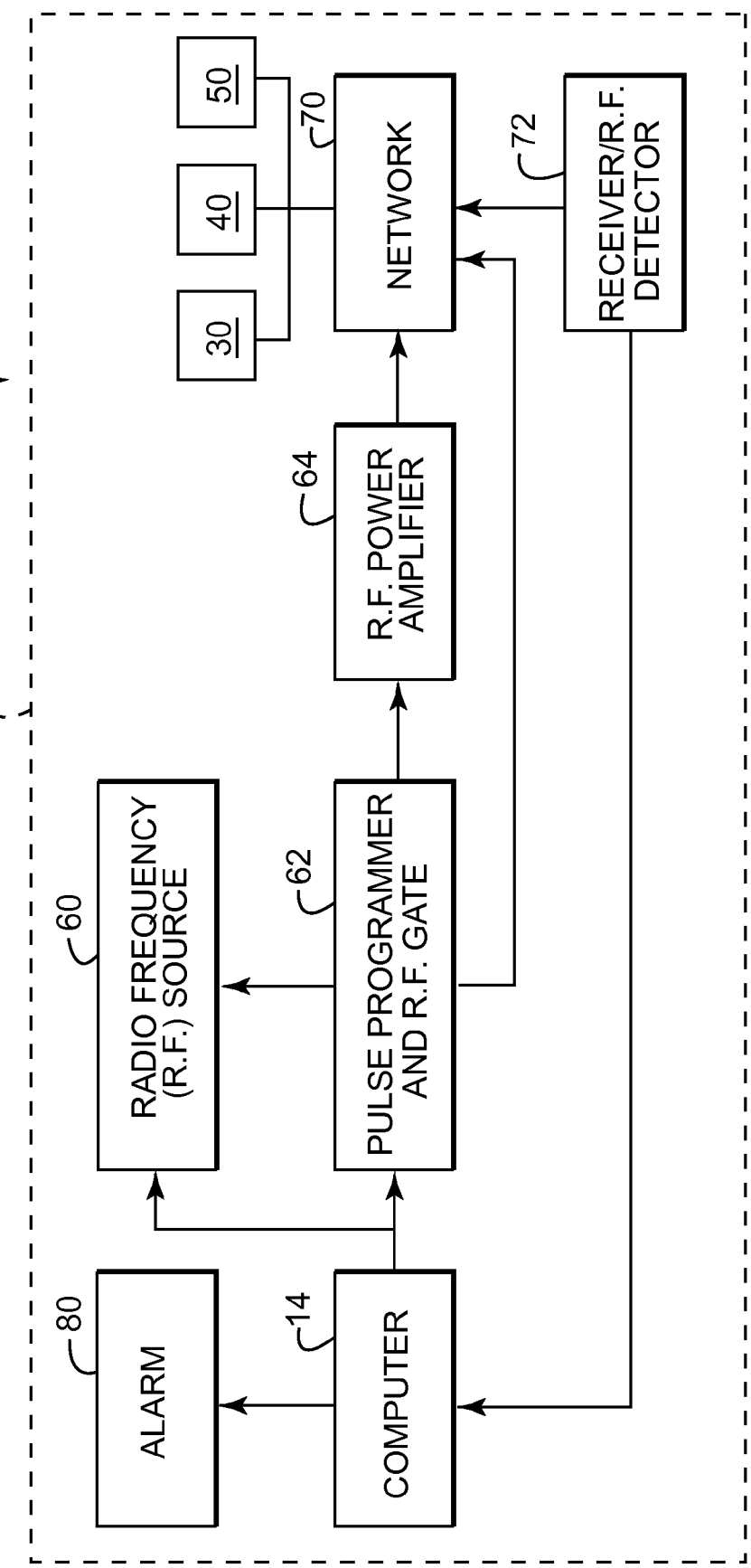
FIG. 5 is a schematic illustrating an embodiment of a nuclear quadrupole resonance ("QR") system that may be used in the embodiment of the passenger inspection system of FIGS. 1, 2, 3 and 4.

FIG. 5 is a schematic illustrating an exemplary radio frequency ("RF") system 46 configured to operate one or more embodiments of the passenger inspection system 10. Referring to FIGS. 1, 3, and 5, an embodiment of the RF system 46 may include a radio frequency source 60, a pulse programmer/radio frequency gate 62, and a radio frequency power amplifier 64, which are configured to generate a plurality of radio frequency pulses having a predetermined frequency to be applied via network 70 to one or more of the inductive NQR sensor unit 30, the metal detector sensor 40, and the weapons detector sensor 50. Within each of these sensors, the radio frequency pulses may be applied to a transmit coil such as, but not limited to, the QR coil 38 (of FIG. 3), the electrically conductive traces 34,35, the electrically conductive traces 42, 44, and/or to the transmit coils 52,54. The applied radio frequency pulses generate an excitation current in the transmit coil. The excitation current(s) generate a magnetic field of a predetermined shape, strength, and/or orientation within one or more of the first detection zone 90, the second detection zone 92, and the third detection zone 93. When the magnetic field collapses, a unique field induction decay current resulting therefrom is detected (or not) by a receive coil such as, but not limited to: the QR coil 38, the electrically conductive traces 42,44, and/or the receive coils 53,54.

Referring still to FIG. 5, the network 70 of traces, circuits, switches, and/or other components may also be configured to conduct a signal from the receive coil, which signal represents the unique field induction decay current, to a receiver/radio frequency detector 72 after the passenger's feet and/or lower legs have been scanned. The computer 14 is configured to operate and coupled with at least the radio frequency source 60, the pulse programmer/radio frequency gate 62, and the receiver/radio frequency detector 72. The computer 14 may be further configured to process and/or analyze one or more signals received from the receiver/radio frequency detector 72 and to determine from the signal processing and/or analysis whether to activate an alarm 80 to indicate that one or more weapons have been detected proximate the passenger's foot, feet, leg, and/or legs.

Figure 6:
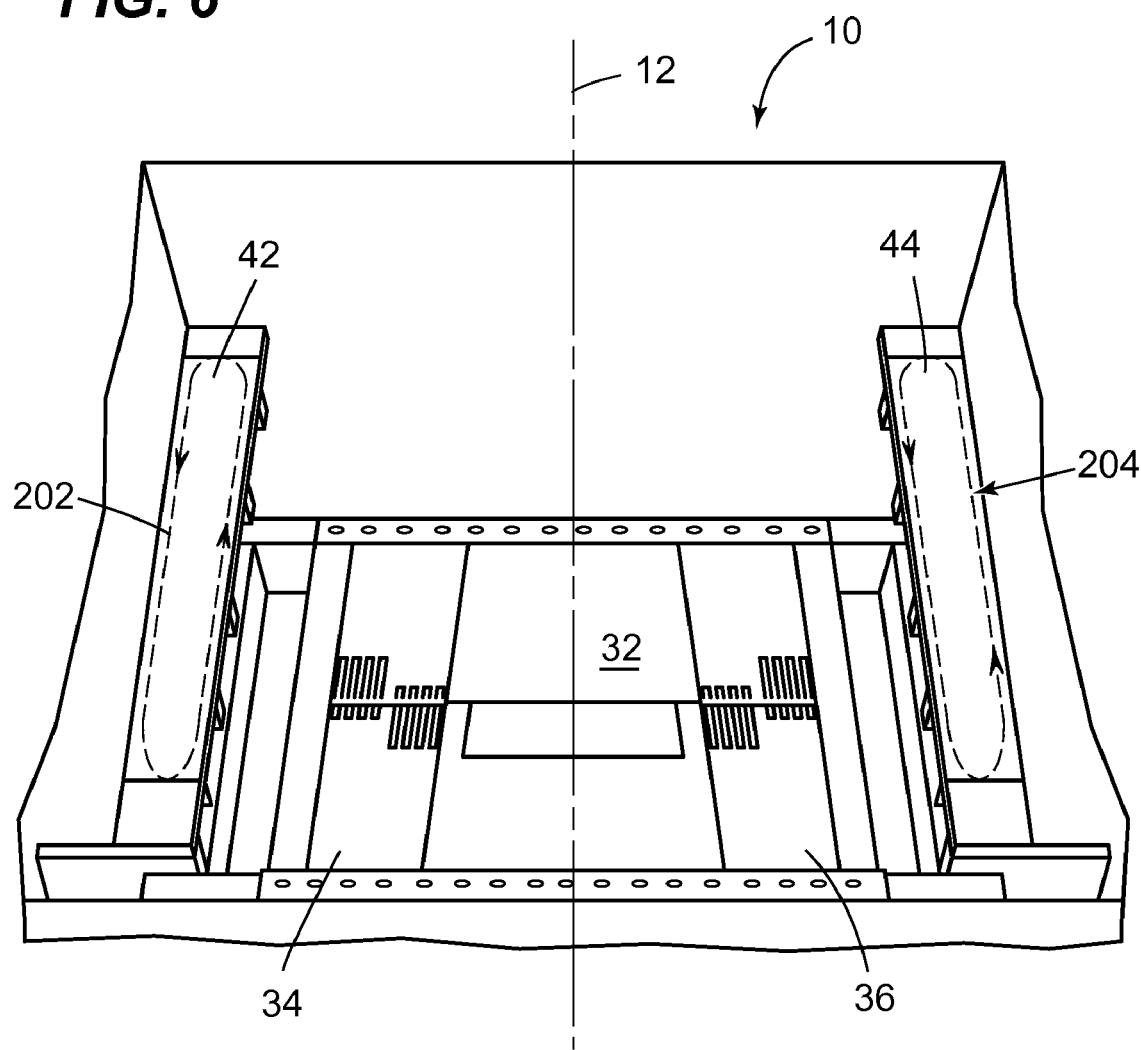
FIG. 6 is a perspective view of an embodiment of the passenger inspection system of FIG. 1.

FIG. 6 is a front perspective view of an embodiment of a passenger inspection system 10 with the interior panels 28 (shown in FIG. 2) removed to more clearly illustrate an exemplary directional flow of excitation current 202 in electrically conductive metal detector trace 42 and an opposite exemplary directional flow of excitation current 204 in electrically conductive metal detector trace 44. In FIG. 6, the transmit coils 52,54 and the receive coils 56,58 (all shown in FIGS. 1, 2, 3) have also been omitted for ease of illustration.

The excitation currents 202,204 may be produced by radio frequency pulses applied to the traces 42,44, respectively, at a predetermined quadrupole resonance ("QR") frequency to couple the metal detector traces 42,44 with the QR coil traces 34,36. As a result, a QR resonance current (not shown) will be generated in the QR coil traces 34,36 whether or not a weapon is present on either side (or both sides) of the medial plane 12. Accordingly, perturbations of the QR resonance current—caused by the presence of a weapon—may be used to detect a weapon proximate the foot of an inspected passenger. If a weapon is detected, further actions, which may include at least activating an alarm, may be taken. If no weapon is detected, the passenger may be allowed to quickly pass through (or bypass) one or more additional security checkpoints.

In FIG. 6, the excitation current loops 202,204 are drawn merely for illustration and would not be visible in an embodiment of the manufactured passenger inspection system 10.

Figure 7:
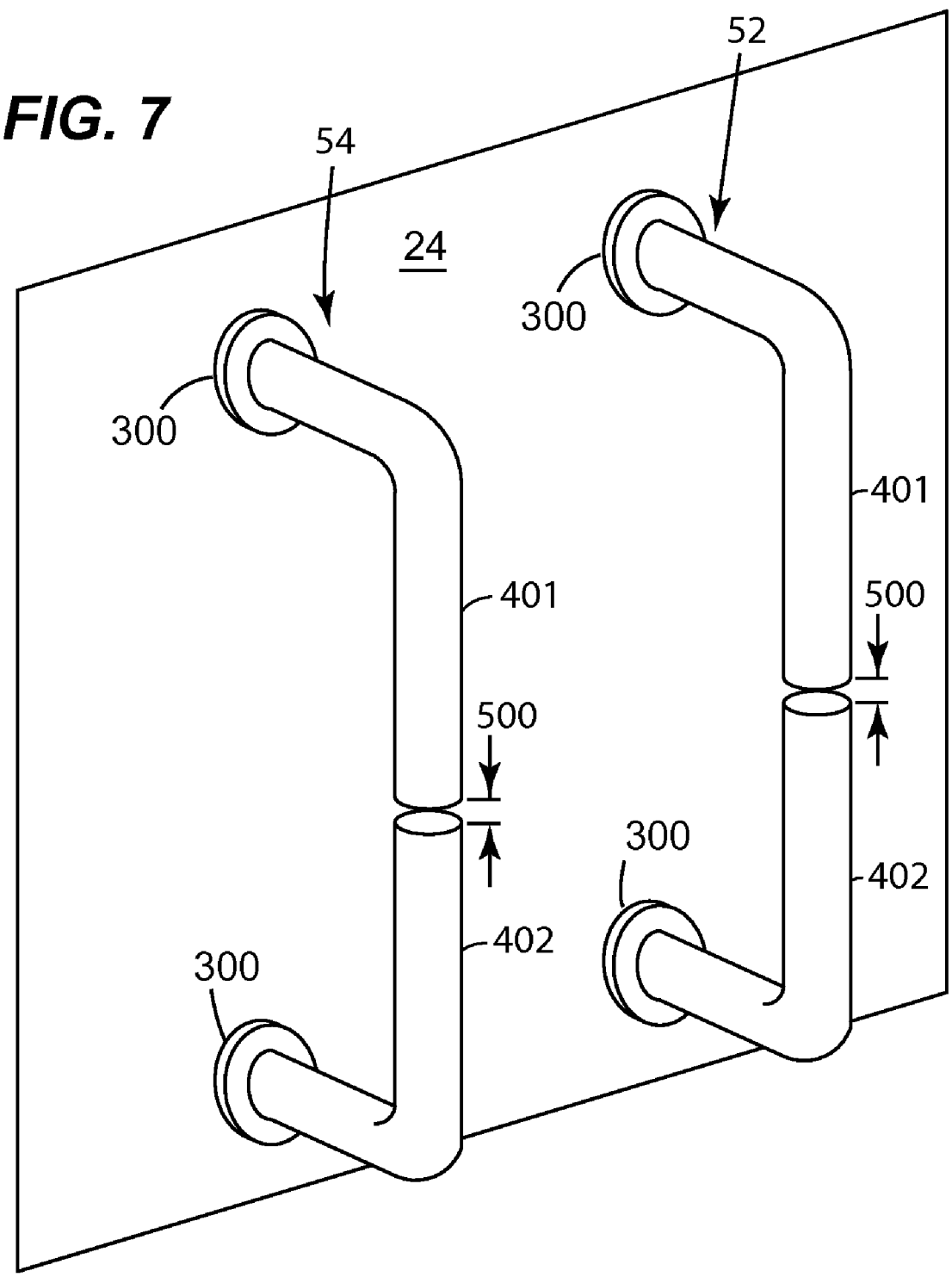
FIG. 7 is a perspective view of an embodiment of a pair of transmit coils configured to detect one or more weapons in a first detection zone that are symmetric with respect to a medial plane that separates an inspected person's foot from the other.
Figure 8:
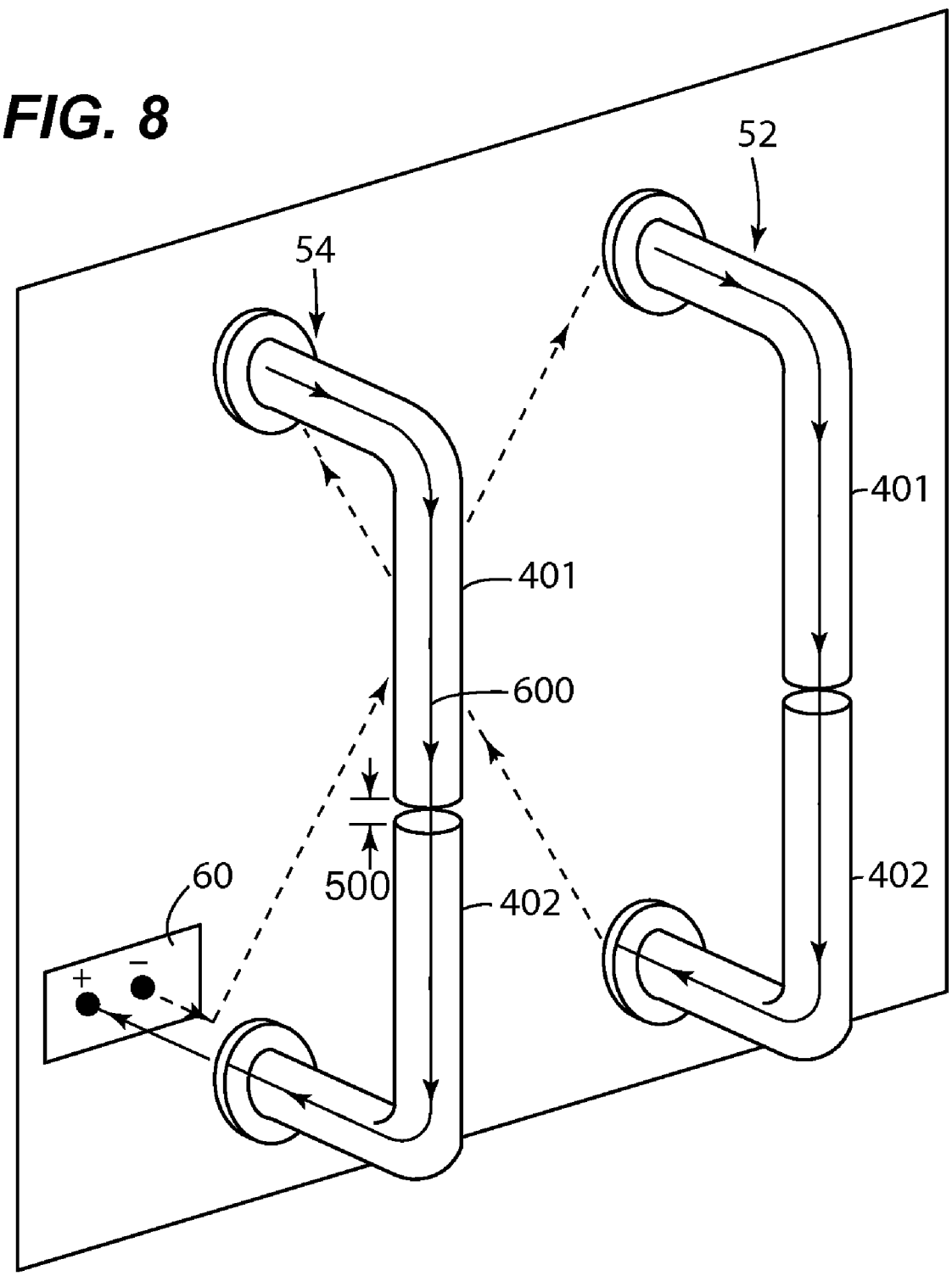
FIG. 8 is a sectional view of the embodiment of transmit coils shown in FIG. 7 that further illustrates how a filament may be configured to produce symmetric excitation current in each of the transmit coils.
Figure 9:
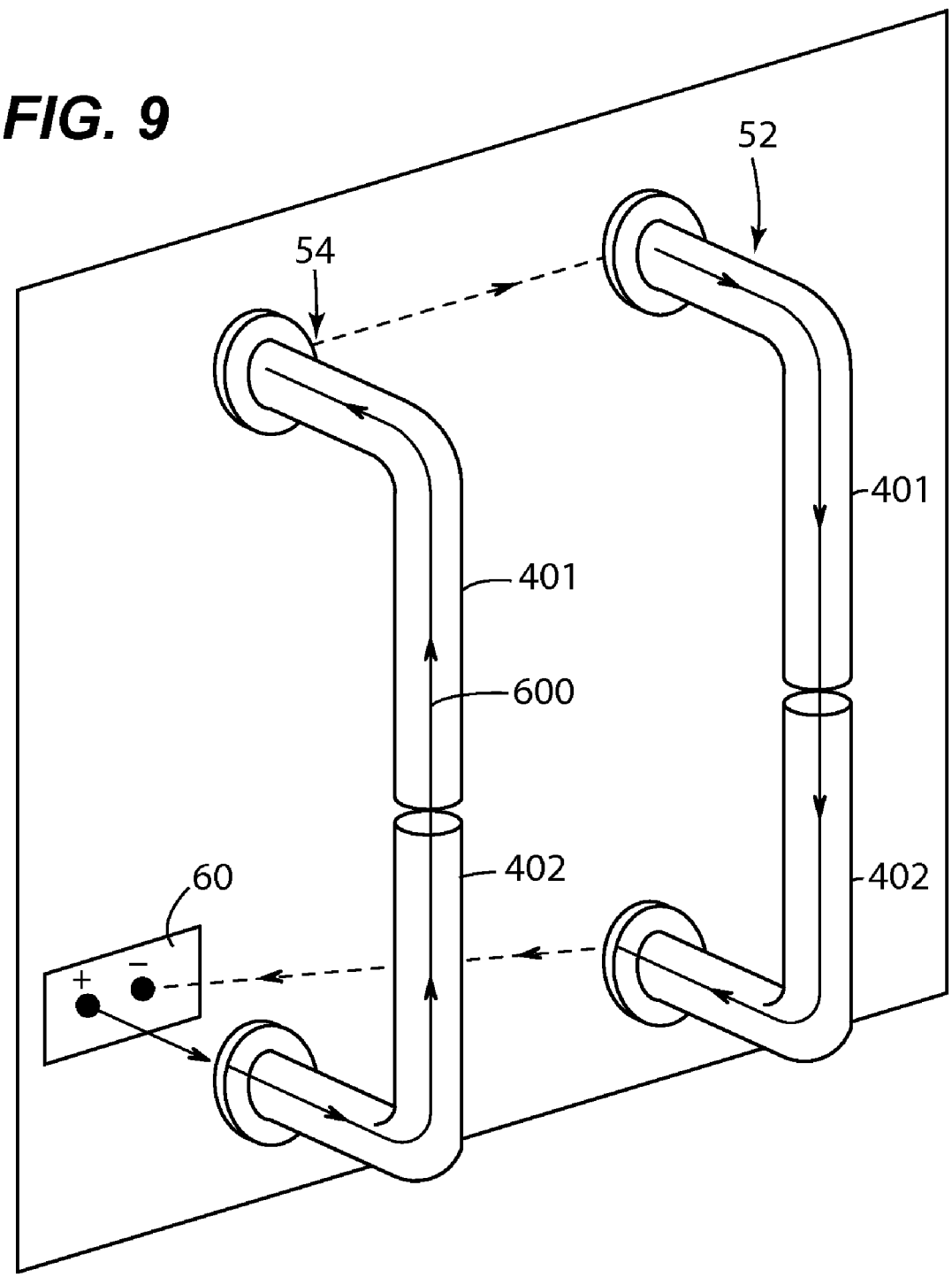
FIG. 9 is a sectional view of the embodiment of transmit coils shown in FIG. 7 that further illustrates how a filament may be configured to produce asymmetric excitation current in each of the transmit coils.

FIGS. 7, 8, and 9 illustrate embodiments of spaced-apart, substantially parallel, transmit coils 52,54 that may be mounted substantially vertically to an interior surface of a sidewall 24 of the passenger inspection system 10 shown in FIG. 1. The receive coils 56,58 (shown in FIGS. 1 and 2, but not shown in FIGS. 7, 8, 9) may be configured identically to or similar to the transmit coils 52,54, but are not described in detail for brevity. The transmit coils 52,54 and their corresponding receive coils 56,58 (mounted substantially vertically to an opposing sidewall 20) may be configured to detect a weapon proximate a passenger's lower leg.

Referring to FIGS. 7, 8, and 9, each transmit coil 52, 54 may include an electrically conductive flange 300, which in one embodiment may be configured to mount an end of the transmit coils 52,54 to the sidewall 24. Each transmit coil 52,54 may be a hollow tube that includes an electrically conductive filament 600 disposed therein and coupled with a radio frequency source 60. The transmit coils 52,54, filament 600, and receive coils 56,58 may be formed of any suitable electrically conductive material(s) and/or combination thereof.

As shown in FIGS. 1, 7, 8, and 9, each transmit coil 52,54 may be electrically insulated from the metal detector trace 44. If each transmit coil 52,54 has a single-piece construction, insulation may be accomplished by disposing an electrically insulative material between an edge of the metal detector trace 44 and a side of each transmit coil 52,54. When (as shown in FIGS. 7, 8, 9) each transmit coil 52,54 has a multi-piece construction, this may be accomplished by disposing a gap 500, which may be filled with air or other insulating material, between a first generally L-shaped portion 401 and a second generally L-shaped portion 402.

The transmit coils 52,54 may be configured to generate either a longitudinal magnetic field or a transverse magnetic field. A longitudinal magnetic field has magnetic flux that is directed parallel or substantially parallel to the longitudinal axis of the foot. Illustratively, the magnetic flux of a longitudinal magnetic field may flow from the toe of the foot to the heel of the foot, or vice versa. A transverse magnetic field has magnetic flux that is directed orthogonally or substantially orthogonally to the longitudinal axis of the foot. Illustratively, the magnetic flux of a transverse magnetic field may flow across the foot from one side to the other.

FIG. 8 illustrates an embodiment of transmit coils 52,54 configured to generate a longitudinal magnetic field. In such an embodiment, the filament 600 is connected to a positive terminal of a radio frequency source 60 and first threaded through the second portion 402 and then through the first portion 401 of the transmit coil 54. After exiting the first portion 401 of the transmit coil 54, the filament 600 is passed through the second portion 402 of the transmit coil 52 and then through the first portion 401 of the transmit coil 52. After exiting the first portion 401 of the transmit coil 52, the filament 600 is connected to the negative terminal of the radio frequency power source 60. A result is that excitation current flowing from the positive terminal to the negative terminal of the radio frequency power source 60 will flow through the transmit coil 54 in the same direction as the transmit coil 62. This parallel flow of excitation current generates the longitudinal magnetic field(s).

FIG. 9 illustrates how the filament 600 may be alternatively routed through the first portion 401 and the second portion 402 of the transmit coils 52,54 to produce anti-parallel excitation current that flows in one direction within the transmit coil 54 and flows in an opposite direction within the transmit coil 52. This anti-parallel flow of excitation current generates the transverse magnetic field.

As shown in FIG. 9, the filament 600 is connected to the positive terminal of the radio frequency source 60, passed through the second portion 402 and into the first portion of the transmit coil 54. After exiting the first portion 401 of the transmit coil 54, the filament 600 is passed through the first portion 401 and the second portion 402 of the transmit coil 52. After exiting the second portion of the transmit coil 52, the filament 600 is connected to the negative terminal of the radio frequency source 60.

Figure 10:
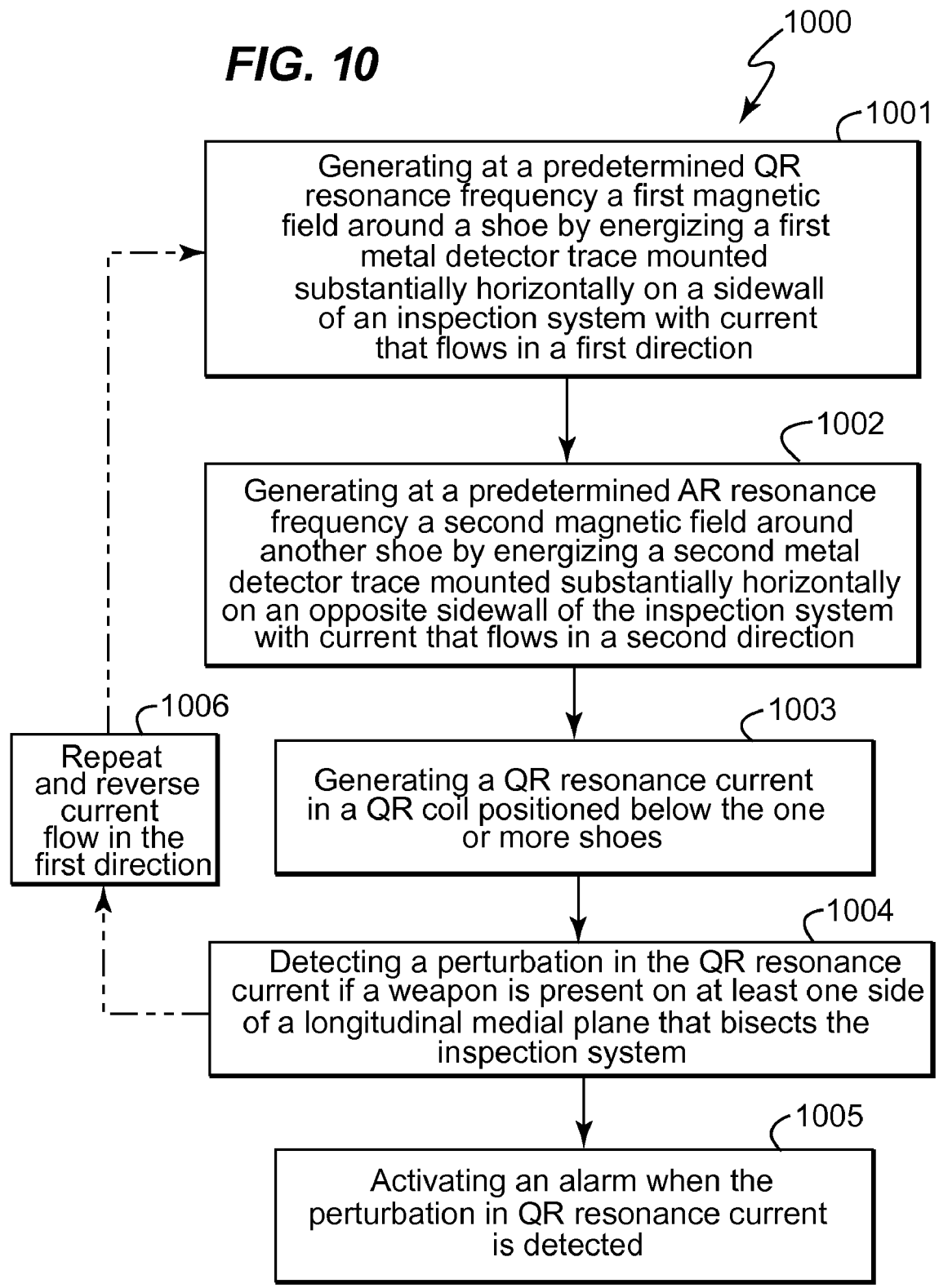
FIG. 10 is a flowchart of an embodiment of another method for detecting one or more weapons in the first detection zone that are symmetric with respect to the medial plane that separates an inspected person's foot from the other.
Figure 11:
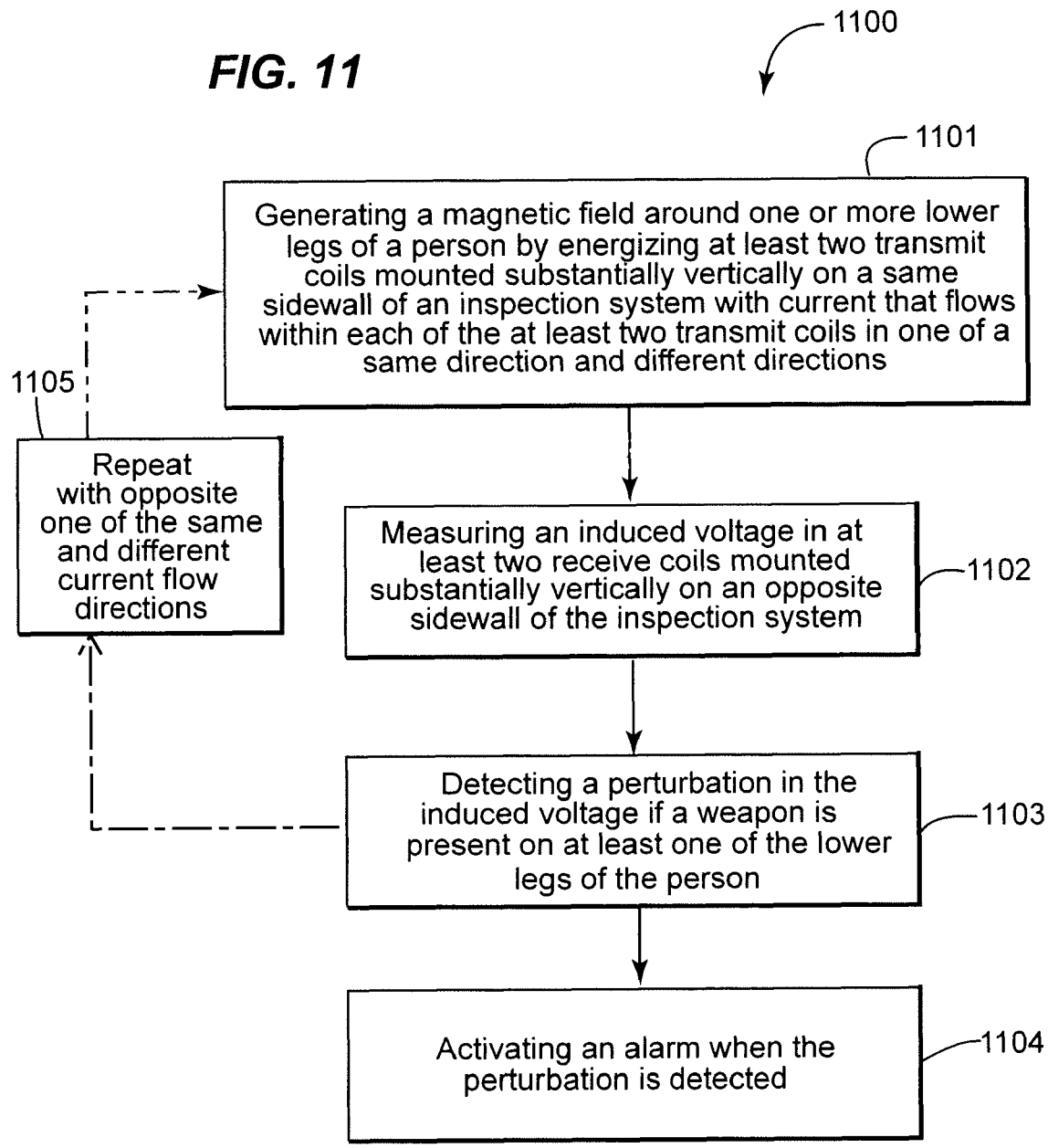
FIG. 11 is a flowchart of an embodiment of a method for detecting one or more weapons in a second detection zone that are symmetric with respect to the medial plane that separates an inspected person's foot from the other.

FIGS. 10 and 11 are flowcharts illustrating embodiments of various methods that may be used to operate the passenger inspection system 10. Unless otherwise noted, the method steps of the exemplary methods 1000 and 1100 may be performed in any suitable order and/or simultaneously. As used herein, the term "simultaneously" refers to at least two actions that occur together (or substantially together) in real-time or in near real-time. By way of example and not limitation, an action may include: a) flowing excitation current in a desired direction, b) inducing a QR resonance current, c) creating a desired type of magnetic field (e.g., longitudinal or transverse), d) inducing a voltage, e) detecting a perturbation of induced resonance current and/or induced voltage, and/or f) producing RF energy. Any of the method steps herein described may comprise one or more actions.

Referring to FIG. 10, another exemplary method for inspecting persons for weapons may include steps 1001, 1002, 1003, 1004, 1005, and 1006. Referring again to FIGS. 1, 2, 3, and 6, the step 1001 may include generating (at a predetermined QR frequency) a first magnetic field around a shoe by energizing a first metal detector trace 44 mounted substantially horizontally on a sidewall 24 of an inspection system 10 with excitation current 202 that flows in a first direction. The step 1002 may include generating (at a predetermined QR frequency) a second magnetic field around another shoe (on an opposite side of a medial plane 12 by energizing a second metal detector trace 42 mounted substantially horizontally on an opposite sidewall 20 of the inspection system 10 with excitation current 204 that flows in a second direction. The second direction of current flow may be in the same direction as the first direction of current flow or in an opposite direction than the first direction of current flow. The step 1003 may include generating a QR resonance current in a QR coil positioned below the shoes. The step 1004 may include detecting a perturbation in the QR resonance current if a weapon is present (within at least the first detection zone 90 (FIG. 3)) and on at least one side of a longitudinal medial plane 12 that bisects the passenger inspection system 10. The step 1005 may include activating an alarm when the perturbation in QR resonance current is detected. The step 1006 may include repeating at least the method steps 1001 and 1002 with the direction of current flow in the first direction reversed.

To improve accuracy of weapons detection, the method 1000 may include first performing at least steps 1001 and 1002 with excitation current that flows in different first and second directions, and may also include subsequently performing at least steps 1001 and 1002 with excitation current that flows in the same first and second directions. Alternatively, the method 1000 may include first performing at least steps 1001 and 1002 with excitation current that flows in the same first and second directions, and may also include subsequently performing at least steps 1001 and 1002 with excitation current that flows in different first and second directions. The method step 1005 of activating an alarm may be performed after a single iteration of RF magnetic fields produced by excitation current flowing in the same or different first and second directions. Alternatively, the method step 1005 of activating an alarm may be performed after a double iteration having first RF magnetic fields produced by excitation current flowing in different first and second directions followed by second RF magnetic fields produced by excitation current flowing in the same first and second directions.

Referring to FIG. 11, an embodiment of a method 1100 for detecting a weapon proximate a person's leg(s) may include steps 1101, 1102, 1103, 1104, and 1105. Referring again to FIGS. 1, 2, and 3 the step 1101 may include generating at least one of a longitudinal or traverse magnetic field around one or more lower legs of a person by energizing at least two transmit coils 52,54 mounted substantially vertically to a same sidewall 24 of the passenger inspection system 10 with excitation current that flows within in one of a same direction and different directions. The step 1102 may include measuring induced voltage in at least two receive coils 56,58 mounted substantially vertically on an opposite sidewall 20 of the passenger inspection system 10. The step 1103 may include detecting a perturbation in the induced voltage if a weapon is proximate at least one of the one or more lower legs. The step 1104 may include least activating an alarm when the perturbation is detected. As further explained below, the step 1105 may include repeating at least steps 1101, 1102, and 1103 with the repeated step 1101 performed with an opposite one of the same and different current directions.

For example, the method 1100 may be performed using a single iteration having only longitudinal RF magnetic fields or having only transverse magnetic fields. Alternatively, the method 1100 may be performed using a double iteration having first longitudinal RF magnetic fields followed by second transverse RF magnetic fields. In yet another embodiment, the method 1100 may be performed using a double iteration having first transverse RF magnetic fields followed by second longitudinal RF magnetic fields. The method step 1104 of activating an alarm may be performed subsequent to a single iteration or subsequent to a double iteration of the method step 1101.

For methods 1000 and 1100 other post-weapon detection steps may include, but are not limited to: notifying appropriate personnel (airport security, police, etc.), directing the scanned passenger to another area of for further inspection, and the like. If no weapon is present, an "all-clear" signal may be given and/or the inspected passenger may be permitted to bypass one or more other security checkpoints.

An advantage of using an embodiment of the method 1100 to operate an inspection system 10 configured as shown in FIGS. 1, 2, 3, 4, and 5 is that a standalone walkthrough metal detector's lowest zone of detection can be turned off to reduce scan times, improve throughput, and/or reduce an amount of electrical power that the walkthrough metal detector consumes per scan. Alternatively, operating a walkthrough metal detector with its lowest zone of detection deactivated can permit higher resolution scans of each person's torso (about waist level and higher). Passengers may be scanned by a walkthrough metal detector (with or without one of its detection zones deactivated) before and/or after they are scanned in an embodiment of a passenger inspection system 10 as described above.

One or more steps of the methods and processes described herein may be implemented in a computer-readable medium using, for example, computer software, hardware, or some combination thereof. For a hardware implementation, the embodiments described herein may performed by a computer, which may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof.

For a software implementation, the embodiments described herein may be implemented with separate software modules, such as procedures, functions, and the like, each of which perform one or more of the functions and operations described herein. The software codes can be implemented with a software application written in any suitable programming language and may be stored in a memory unit, and executed by a computer processor. The memory unit may be implemented within the processor or external to the processor, in which case it can be communicatively coupled to the processor using known communication techniques. An exemplary memory unit may be implemented using any type (or combination) of suitable volatile and non-volatile memory or storage devices including random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, or other similar or effective memory or data storage device.

An embodiment of a passenger inspection system configured as described herein may be used to implement the Registered Traveler program sponsored by the U.S. Transportation Security Administration (TSA). This program is designed to provide expedited security screening for passengers who volunteer biometric and biographic information to a TSA-approved vendor and who successfully complete an initial security threat assessment. As mentioned above, the passenger inspection system may include an asymmetric nuclear quadrupole resonance (NQR) or nuclear magnetic resonance (NMR) shoe scanner, a metal detector, and a weapons detector. Additionally, embodiments of the passenger inspection system may be integrated with a trace detection portal, an identification kiosk, a full body metal detector, and the like.

For example, rather than standing in slow-moving security lines, registered travelers may bypass such security lines and walk into an embodiment of a passenger inspection system constructed in accordance with the principles of the invention. Once positioned within an embodiment of the inspection system, the registered travelers may have their ID card information and/or biometric information validated by an identification kiosk that forms part of the inspection system. At about the same time, the registered travelers may be scanned by the inspection system's metal detection sensor, QR sensor, and/or weapons detection sensor for the presence of metallic objects such as weapons. Additionally, the registered travelers may be screened by the inspection system's QR sensor for the presence of alarm objects, that are in, on, and/or proximate their shoes. If a weapon or another type of alarm object is detected, the registered traveler may be asked to undergo additional security inspection and/or screening. If the registered traveler's identity is properly verified, and no weapons or other types of alarm objects are otherwise detected, the registered traveler may be permitted to quickly pass through (or bypass) one or more security checkpoints required for non-registered travelers.

A detailed description of various embodiments of the invention has been provided; however, modifications within the scope of the invention will be apparent to persons having ordinary skill in the above-referenced technological field. Such persons will appreciate that features described with respect to one embodiment may be applied to other embodiments. Thus, the scope of the invention is to be properly construed with reference to the following claims.

What is claimed is:

1. A method for detecting a weapon in at least one of a first shoe and a second shoe worn by a person, the method comprising:
    positioning the first shoe and the second shoe within an inspection system comprising a first metal detector trace and a second metal detector trace, the first metal detector trace mounted substantially horizontally on a first sidewall of the inspection system with current that flows in a first direction, and the second metal detector trace mounted substantially horizontally on a second sidewall of the inspection system opposite the first sidewall with current that flows in a second direction;
    generating at a predetermined quadrupole resonance frequency a first magnetic field around the first shoe by energizing the first metal detector trace to scan the first shoe;
    simultaneously generating at the predetermined quadrupole frequency a second magnetic field around the second shoe by energizing the second metal detector trace to scan the second shoe simultaneously with the first shoe;
    generating a quadrupole resonance current in at least one electrically conductive trace positioned below at least one of the first shoe and the second shoe; and
    detecting a perturbation in the quadrupole resonance current when a weapon is present on at least one side of a longitudinal medial plane that bisects the inspection system.

2. The method of claim 1, further comprising activating an alarm when the perturbation in the quadrupole current is detected.

3. The method of claim 1, further comprising repeating the method steps of claim 1 with the first direction of current flow reversed.

4. The method of claim 1, further comprising:
  positioning at least one electrically conductive trace below the first metal detector trace and the second metal detector trace; and
  positioning a quadrupole resonance transmit coil below the at least one electrically conductive trace.

5. An inspection system for detecting a weapon proximate at least one leg of a person, the inspection system comprising:
  a first metal detector trace mounted substantially horizontally on a first sidewall of the inspection system, the first metal detector trace shown to scan a first leg of the person;
  at least one transmit coil mounted substantially vertically to the first sidewall of the inspection system and configured to generate at least one of a longitudinal magnetic field and a transverse magnetic field within a scanning area of the inspection system; and
  a second metal detector trace mounted substantially horizontally on a second sidewall of the inspection system, the second sidewall opposite the first sidewall, the second metal detector trace configured to scan a second leg of the person simultaneously with the first leg.

6. The inspection system of claim 5, wherein the at least one transmit coil is configured to carry excitation current that flows within each of the at least one transmit coil in one of a same direction and different directions.

7. The inspection system of claim 6, further comprising at least one receive coil configured to carry a voltage induced by at least one magnetic field created by the excitation current, and wherein the inspection system further comprises:
  a computer configured to detect a perturbation in the induced voltage if a weapon is present proximate the at least one leg of the person.

8. The inspection system of claim 7, wherein the at least one magnetic field comprises:
  the longitudinal magnetic field generated when the excitation current flows in the at least one transmit coil in the same direction; and
  the transverse magnetic field generated when the excitation current flows in the at least one transmit coil in different directions.

9. The inspection system of claim 5, further comprising:
  at least one electrically conductive trace positioned below the first metal detector trace and the second metal detector trace; and
  a quadrupole resonance transmit coil positioned below the at least one electrically conductive trace.

10. The inspection system of claim 5, wherein each of the at least one transmit coil comprises:
  a hollow, electrically conductive tube; and
  an electrically conductive filament disposed within an interior of the hollow, electrically conductive tube.

11. The inspection system of claim 10, wherein a first portion of the electrically conductive filament crosses a second portion of the electrically conductive filament that is positioned outside of the interior of the hollow, electrically conductive tube, and the electrically conductive filament is configured to carry the excitation current in the same direction in each of the at least one transmit coil.

12. The inspection system of claim 10, wherein no portion of the electrically conductive filament crosses another portion of the electrically conductive filament that is positioned outside of the interior of the hollow, electrically conductive tube, and the electrically conductive filament is configured to carry the excitation current in the different directions in the at least one transmit coil.

* * * * *